United States Patent
Gordon et al.

(10) Patent No.: US 6,597,596 B2
(45) Date of Patent: Jul. 22, 2003

(54) CONTENT ADDRESSABLE MEMORY HAVING CASCADED SUB-ENTRY ARCHITECTURE

(75) Inventors: Tarl S. Gordon, Burlington, VT (US); Rahul K. Nadkarni, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/286,206

(22) Filed: Nov. 1, 2002

(65) Prior Publication Data

US 2003/0065880 A1 Apr. 3, 2003

Related U.S. Application Data

(62) Division of application No. 09/878,525, filed on Jun. 11, 2001.

(51) Int. Cl.[7] ............................................. G11C 15/00
(52) U.S. Cl. .................................... 365/49; 365/189.07
(58) Field of Search ............................. 365/49, 189.07, 365/230.03, 189.08, 154

(56) References Cited

U.S. PATENT DOCUMENTS

| | | | |
|---|---|---|---|
| 3,575,617 A | 4/1971 | Burns | 307/279 |
| 5,258,946 A | 11/1993 | Graf | 365/49 |
| 5,396,449 A | 3/1995 | Atallah et al. | 365/49 |
| 5,517,441 A * | 5/1996 | Dietz et al. | 365/49 |
| 5,704,054 A | 12/1997 | Bhattacharya | 395/388 |
| 5,798,645 A | 8/1998 | Zeiner et al. | 364/578 |
| 5,978,246 A | 11/1999 | Shindo | 365/49 |
| 6,108,227 A * | 8/2000 | Voelkel | 365/49 |
| 6,259,620 B1 * | 7/2001 | Kling et al. | 365/49 |
| 6,324,087 B1 * | 11/2001 | Pereira | 365/49 |

* cited by examiner

*Primary Examiner*—Richard Elms
*Assistant Examiner*—Anh Phung
(74) *Attorney, Agent, or Firm*—Robert A. Walsh (57) ABSTRACT

A growable CAM array and an ASIC-compatible CAM architecture based on modular cascadable CAM blocks, each CAM block containing a sub-entry including a segment of the match line of a CAM entry, each block's output being its match-line segment's voltage gated by a combinatorial logic gate. Each sub-entry's structure is that of a short CAM entry with a short Match Line (a match line segment) with a small capacitance. Each CAM block outputs a signal that can enable or inhibit a CAM search in the sub-entry in the next CAM block. A variety of exemplary circuits for gating match line segments within CAM blocks, and methods of selecting and combining the resulting variety of CAM blocks to obtain power-savings and/or high performance. An ASIC library including library elements having electrical rules that describe devices within and describe interconnections between the devices within a CAM block.

21 Claims, 8 Drawing Sheets

CONTENT ADDRESSABLE MEMORY HAVING CASCADED SUB-ENTRY ARCHITECTURE

This application is a division of application No. 09/878,525 filed Jun. 11, 2001, which is now U.S. Pat. No. 6,512,684 issued on Jan. 28, 2003.

TECHNICAL FIELD

The invention relates generally to content addressable memory (CAM) devices, and more specifically, to the design and use of a CAM circuit having a plurality of cascaded sub-entries, each sub-entry having a Match-enabled output adapted to enable the CAM search operation of the next sub-entry.

RELATED ART

A Content Addressable Memory (CAM) is a device adapted to perform fast searches of list-based data stored in a plurality of locations called CAM entries. Each CAM entry stores a word (i.e., a plurality of binary or ternary bits) of data in a plurality of CAM cells, and includes circuits to perform comparisons with an externally asserted comparand word typically stored in a comparand buffer.

In many CAM circuits of the related art, all of the CAM cells of a given CAM entry are tied directly to the same Match Line (ML) and share a single distributed Match Line Pass-Gate (i.e., the sum of all XNOR circuitry of all the CAM cells in that Match Line's CAM entry) which performs the logical comparison function and which is connected between the Match Line and a Low voltage level.

The Match Line of a CAM entry functions as a single capacitor having capacitance ($C_{ML}$) that is pre-charged (e.g., through pre-charge transistor) to a logic High voltage (e.g., Vdd) prior to each search, and the observable event on each Match Line will be a MISS (the logical opposite of a MATCH which may be called a HIT), which will cause the Match Line voltage to drop (discharge towards ground voltage) from the pre-charged High voltage to a Low voltage through the Match Line Pass-Gate.

In the CAM arrays of the related art, as the size (i.e., width X) of the binary word storable in each CAM entry is increased, the capacitance ($C_{ML}$) of each CAM entry's Match Line generally increases proportionately. Thus, in the related art, the Match-sensing hardware designer is faced with the problem of reliably detecting the much smaller and slower voltage change on a Match Line having a potentially large and entry-width-dependent capacitance. Accurate Match-detection requires a circuit to distinguish between the characteristics of a MATCH-ing entry from the characteristics of a MISS-ing entry having as few as only one mismatched data bit (i.e., providing only one conducting leg in the Match Line Pass Gate through which to discharge the Match Line capacitor to the Low voltage). The larger the Match Line's capacitance ($C_{ML}$), the longer it will take to discharge in the case of a MISS-ing entry, in turn requiring a longer detection period. This generally requires customized sensing circuitry tailored for a specific CAM entry width, and therefore limits the scalability of the CAM circuits of the related art. And, the larger the CAM entry, the greater is the challenge to the designer to define reliable strobing protocols and sensing margins necessary to activate a reliable MATCH or HIT output signal, while maximizing the search frequency. Because only one search at a time can be performed on a CAM entry having one Match Line, the maximum frequency of CAM search operations generally decreases as the width of the CAM entry is increased.

Since the energy consumed ($E_{CAP}$) by the complete discharge of a capacitor (e.g., a Match Line) is equal to $\frac{1}{2}CV_{cap}^2$, where C is the capacitance and $V_{cap}$ is the Voltage across the capacitor, the energy consumed per search by each MISS (e.g., $E_{MISS}=E_{CAP}$) with single Match Line systems can increase approximately proportionally with the increased size (bits) of the word storable in the CAM entry. Match Lines in wider CAM entries have larger capacitance associated with them and will therefore consume more power during a search operation and have lower search frequency.

The explosive growth and increasing speed of Intranets and the Internet is fueling the demand for larger, faster, and more energy-efficient CAM circuits. The large CAM memory arrays of the related art can consume multiple watts of power during performance of search operations. It is desirable that the entry-width of CAM arrays may be increased without additional power consumption and/or without reducing the CAM search frequency significantly. A growable CAM architecture (e.g., a data word-width scalable CAM circuit architecture) is desirable for reducing the burdens on circuit designers when implementing wider CAM circuits.

SUMMARY OF THE INVENTION

The present invention overcomes the problems and limitations of the related art by providing a cascadable CAM sub-entry architecture based on CAM blocks, and a plurality of exemplary circuits for gating match line segments within CAM blocks, and methods of selecting and combining these blocks to obtain power-savings and/or high performance.

It is desirable that a wide CAM array will consume only minimal energy during operation, and operate at a high speed and/or at a high CAM search frequency, and that each CAM search will reliably generate a Match/HIT output for only CAM entries storing a MATCH-ing word. Accordingly, a first aspect of the invention provides a content addressable memory (CAM) device comprising: a first CAM block having a binary first block input and a binary first block output and including a first sub-entry. The first sub-entry includes one or more CAM cells, each CAM cell in the first sub-entry being coupled to a first match line segment and to a first search-enabling line segment. The device further comprises a first combinatorial logic gate having a binary first gate output and a first gate input, the first gate input being the first match line segment, the first gate output being the first block output. A CAM comparison is performed on the first sub-entry only if a predetermined binary logic voltage level is being asserted at the binary first block input. The first block output will assert the predetermined binary logic voltage level if the first sub-entry is a match-ing sub-entry.

A second aspect of the invention provides a content addressable memory array comprising a plurality of CAM entries, each CAM entry being segmented into first, second and third sub-entries, the first, second and third sub-entries including a first, second and third match-line segment respectively. The first match-line segment is operatively coupled to the second match-line segment through a first combinatorial logic gate, the second match-line segment is operatively coupled to the third match-line segment through a second combinatorial logic gate.

A third aspect of the invention provides a digital system, such as for example, a computer, or a network router, comprising a digital processor operatively coupled to a CAM array, the CAM array having cascaded CAM blocks, as in the forgoing aspects of the invention.

A fourth aspect of the invention provides an ASIC library comprising an ASIC library element having electrical rules that describe devices within and describe interconnections between the devices within a CAM block in accordance with embodiments of the invention.

A fifth aspect of the invention provides a method of performing a CAM comparison on a CAM entry, the method comprising: providing a first CAM block including a binary first block input, a binary first block output, a first CAM cell, the first CAM cell being operatively coupled to the first block input and to the first block output; and performing a CAM comparison on the first CAM cell only if a predetermined binary logic voltage level is asserted at the binary first block input; and asserting the predetermined binary logic voltage level at the first block output.

A sixth aspect of the invention provide a method of performing a CAM comparison on a CAM entry having a first sub-entry and a second sub-entry, the method comprising: providing a first CAM block having a binary first block input and a binary first block output and including the first sub-entry, the first sub-entry having one or more CAM cells; performing a CAM comparison on the first sub-entry only if a predetermined binary logic voltage level is being asserted at the binary first block input; asserting the predetermined binary logic voltage level at the first block output if the CAM comparison on the first sub-entry detects a MATCH-ing sub-entry; providing a second CAM block having a binary second block input and a binary second block output, wherein the first block output is the second block input, and the second CAM block includes the second sub-entry, the second sub-entry having one or more CAM cells; performing a CAM comparison on the second sub-entry only if the predetermined binary logic voltage level is being asserted at the binary second block input; asserting the predetermined binary logic voltage level at the second block output if the CAM comparison on the second sub-entry detects a MATCH-ing sub-entry.

Each CAM block contains a sub-entry, a match line segment, and a match line sensing and gating circuit (e.g., an AND-gate) to control CAM search timing and CAM block output. A plurality of CAM blocks are cascaded (i.e., coupled serially) such that the output of each serves as an input for the next. The output of each CAM block containing a sub-entry may be connected in series with the input of another CAM block containing the next sub-entry, to create a large CAM entry of any desired width. A given sub-entry (after the first sub-entry) is compared to its respective portion of the comparand only if the previous sub-entry was a MATCH-ing sub-entry with respect to its respective portion of the comparand.

Each sub-entry is basically a short CAM entry that has a correspondingly short Match Line (a match line segment) with a relatively small capacitance. Each CAM entry includes a plurality of sub-entries, and therefore, a plurality of Match Line segments. Each CAM block has a search-enabling input and also an output. The plurality of CAM blocks are cascaded (i.e., coupled serially) such that the output of each serves as an input for the next which inhibits or enables the CAM comparison function within CAM sub-entry contained within the block. Each CAM block also has an output to indicate the result of a CAM search comparison on the portion of the entry contained within that block.

Each one of the plurality of match line segments in a given CAM entry is coupled directly to the respective comparison circuit (e.g., XNOR function) of the CAM cells within its respective sub-entry and is further coupled (through a combinatorial logic gate, e.g., an AND gate or a NAND gate) to the match line segment (ML) and search enabling lines (SE) of each adjacent (i.e., next) sub-entry. A word stored in an entry that "matches" the comparand, results in maintaining the pre-charged High voltage on the match line segment of every sub-entry within such an entry and consequently the output of each CAM block and the HIT output line voltage ($V_{HL}$) of that CAM cascade is a logic High (i.e., True) voltage level. Conversely, all entries that contain even a single bit that mis-matches (i.e., does not logically match) a comparand's corresponding bit results in a HIT output of a Low voltage (i.e., False). It would be apparent to persons skilled in the art that the (High-Low; positive-negative) electrical polarity of signals and of elements may be reversed at some or all portions of the circuit without departing from the teachings and scope of the claims of the herein disclosed invention.

BRIEF DESCRIPTION OF THE DRAWINGS

The exemplary embodiments of the present invention will hereinafter be described in conjunction with the appended drawings, where like designations denote like elements, and:

FIG. 3di depicts a circuit diagram of a third alternative CAM block including a Match-Line gating circuit having its output delayed by an external clock signal, for use as one or more of the CAM blocks of each CAM cascade in FIGS. 2b or 3dii;

FIG. 3dii depicts a circuit diagram of a CAM array comprised of a plurality of CAM cascades each comprising a plurality of the CAM blocks of FIG. 3di and sharing external clock signal lines;

DETAILED DESCRIPTION OF INVENTION

The invention provides a CAM array comprised of a plurality of CAM cascades, each CAM cascade containing one CAM entry. Each CAM cascade is constructed of a plurality of CAM blocks connected in series. Each CAM block contains a CAM sub-entry (i.e., a subset of the stored bits of the CAM entry), which can be compared to a corresponding portion of the comparand when the CAM block is search-enabled. The sub-entry in each CAM block has a match line (ML) segment, and a search-enabling (SE) line segment, and a logic gate used to detect a MATCH-ing sub-entry within the CAM block. Each CAM block has a search-enabling input (IN) which can inhibit or enable the CAM comparison function within the CAM sub-entry contained within the block. Each CAM block also has an output (OUT) that can indicate the result of a CAM search comparison that has been performed on the portion of the entry (i.e., the CAM sub-entry) contained within that CAM block. The output (OUT) of each CAM block indicates the CAM partial search result up to and including that block.

Each CAM sub-entry is basically a short CAM entry that has a correspondingly short match line segment with a relatively small capacitance. The CAM blocks of each CAM cascade in the CAM array are connected in a cascading manner such that the output of each CAM block serves as the search-enabling input for the next CAM block.

The inventive CAM system achieves its search performance by comparing each of a plurality of sub-entries (i.e., small CAM entries containing a sub-set of the CAM cells of the wider CAM entry) in the CAM array with the respective bits of the externally applied "comparand", in a cascading manner. Each CAM entry will include a plurality of CAM sub-entries, and therefore, a plurality of match line segments. Each vertical column of CAM cells in a CAM array has a pair of differential Search Lines inputs (e.g., SLT and its complement SLC) which are coupled to a comparand buffer. Each horizontal CAM entry may be coupled to a "Word Line" coupled to all the memory cells of the entry, and bit-lines may be coupled to each cell of the entry, to support the writing and reading of data into each memory cell of the entry.

The switching transistors employed in the circuits of the present invention may be field effect transistors (FETs), and may be of the metal oxide semiconductor (MOS) type. Each such transistor includes a source electrode, a drain electrode, a conduction channel between these electrodes and a gate electrode for controlling whether the channel is conducting (i.e. switch is ON) or non-conducting (i.e., the switch is OFF). The N-Type transistors function as normally-open (NO) switches, that is, they will be non-conducting (i.e., OFF) until a logic High voltage level is asserted at its gate electrode. Conversely, the P-Type transistors function as normally-closed (NC) switches, that is, they are conducting with no (i.e., logic Low) voltage applied to its gate and conduct until a logic High voltage level is asserted at its gate electrode. Each inverter in the inventive circuits may be constructed of a P-type transistor stacked drain-to-drain upon an N-Type transistor, the input of the inverter thus formed being the gates of both transistors and the inverter's inverted output being the common drain node, as is well known in the art. An AND gate having two inputs in the inventive circuits may be constructed of a two-input NAND gate having its output inverted by an inverter. A NAND gate having two inputs may be constructed in the conventional manner with two P-type transistors and two N-type transistors. A three-input AND gate may be constructed of two two-input AND gates, or by a 3-input NAND gate with its output inverted by an inverter, or by any other transistor arrangement known by persons skilled in the art.

Embodiments of the present invention provide circuitry and methods of operation that can include many known CAM-cell circuit topologies (e.g., Binary/Ternary/Global Masking CAM cells; SRAM/DRAM CAM cells; NFET/PFET CAM cells), such as, for example the conventional binary SRAM CAM cell of FIG. 1.

Figure 1:
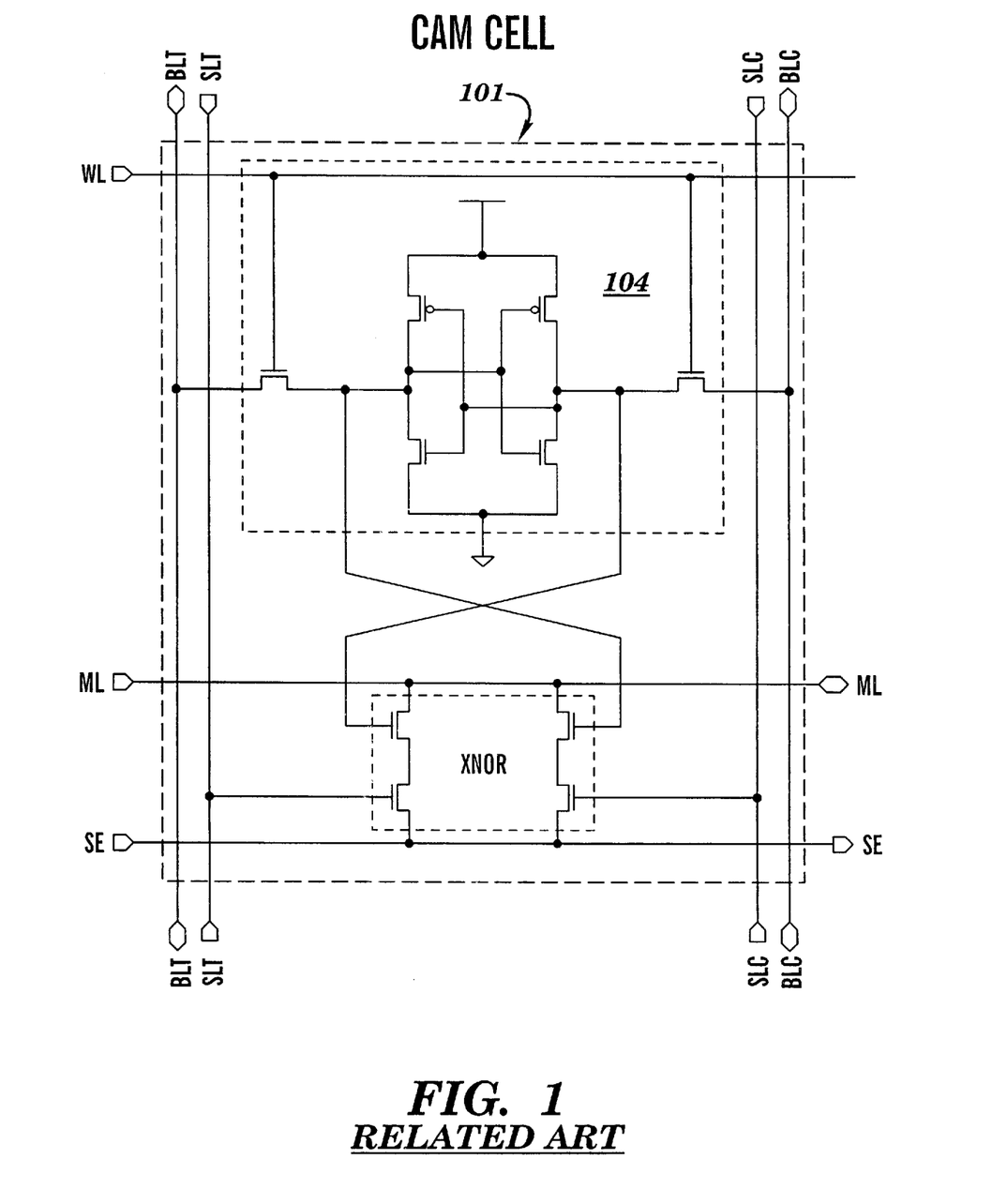
FIG. 1 depicts a circuit diagram of a Content Addressable Memory (CAM) cell of the related art having a Match Line (ML) and a Search Enable (SE) line.

FIG. 1 depicts a CAM cell 101 of the related art that can be joined, through the Word Line (WL), Match Line (ML) and the Search Enable (SE) line, to a plurality of other identical CAM cells 101 to form a CAM entry of the related art, or to form a CAM sub-entry within a CAM block in accordance with embodiments of the present invention. A plurality of such inventive CAM sub-entries (or CAM entries in the related art) are joined through the plurality of Bit Lines (e.g., BLT and BLC) and the Search Lines (e.g., SLT and SLC) to form a CAM array. As depicted in FIG. 1, the CAM cell 101 differs from a Random Access Memory (RAM) storage cell 104 in that the CAM cell adds a comparison logic circuit (e.g., the XNOR pass-gate) to the memory storage cell 104 within the CAM cell 101, to provide the content-addressable functionality. The CAM search operation of the CAM cell 101 may be selectively enabled or disabled by asserting a logic Low voltage level or a logic High voltage level respectively, at the search enable line (SE).

The Match Line Pass-Gate of an inventive CAM sub-entry is a distributed pass-gate comprised of the plurality of parallel pass-transistors (e.g., within the XNOR function) that are controlled by comparand bits (i.e., asserted True and Complemented) asserted on the Search Lines (e.g., Search Line True (SLT) and Search Line Complement (SLC)) and by the logic state of the data storage cell(s) (e.g., 104) of each of the plurality of CAM cells 101. In the case of a MATCH-ing sub/entry (a CAM entry or a CAM sub-entry storing data that entirely matches the presently asserted data of a comparand), the Match-Line Pass-Gate of the MATCH-ing sub/entry will remain OFF (i.e., non-conducting). Therefore, the pre-charged match line segment of a MATCH-ing sub-entry will remain High after the search-enabling line (SE) is lowered to a Low voltage level. Conversely, the pre-charged match line segment of a MISS-ing sub-entry will drop Low after the search-enabling line (SE) is lowered to a Low voltage level.

Figure 2A:
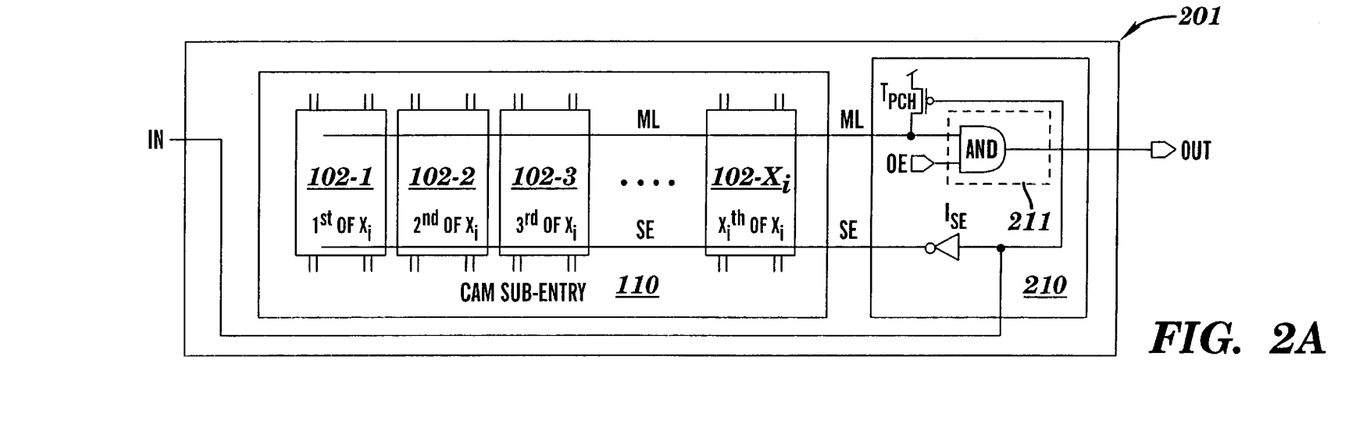
FIG. 2a depicts a circuit diagram of a generic inventive CAM block comprising a CAM sub-entry including a match line segment and a search enable line segment, a search-enabling input, and an output asserted by a match line gating circuit, in accordance with embodiments of the invention.

FIG. 2a depicts a circuit diagram of a single generic CAM block 201 (e.g., a generic inventive CAM block that can be one of CAM block species 201a, 201b, 201c, 201d, 201e shown in FIGS. 3a, 3b, 3c, 3di, and 3e) comprising a CAM sub-entry 110 coupled to a generic inventive gating circuit 210 through the match line segment (ML) and through the Search Enable (SE) line segment. Upon initialization (e.g., Input IN held to a Low voltage level), the output OUT line of the CAM block 201 will be at a logic Low voltage level. The CAM block 201 is initialized by holding its input (IN) line at a Low voltage level. In embodiments where the match line precharge transistor (e.g., $T_{PCH}$) is controlled directly by the input IN line, the Low initialization voltage on the input IN line must continue long enough for the included match line segment (ML) to become pre-charged to a logic High voltage level through the pre-charge transistor (e.g., $T_{PCH}$).

The Low initialization voltage will also pull the Search Enable (SE) line segment to a logic High voltage level, thus preventing any CAM search comparison operation in the included sub-entry 110, by preventing the discharge of its match line (ML) segment (irrespective of the stored data and irrespective of the state of the Search Lines). The CAM search function will be disabled (preventing the discharge of the match line segment) until the Search Enable (SE) line segment is lowered to a Low voltage level (e.g., which may be done by raising the input (IN) line to a logic High voltage level). The Low initialization voltage asserted at the input IN line can also hold the CAM block's 201 binary output OUT Low, through the ordinary operation of a combinatorial logic gate 211 (e.g., an AND gate, as shown in FIGS. 2a, 3a, 3b, 3c, 3di, 3e) in embodiments of the gating circuit 210 that connect the CAM block's input line (IN) to the output enable (OE) input node/line of the combinatorial logic gate 211 (see e.g., gating circuits in FIGS. 3a, 3b, 3c, 3di, 3e). Thus, the Low initialization voltage on the input IN line of a first CAM block (e.g., 201-1 in FIG. 2b) will cause a Low voltage on the output line OUT of the first CAM block (e.g., 201-1 in FIG. 2b), which will assert the Low initialization voltage at the input IN of the next (e.g., second) CAM block (e.g., 201-2 in FIG. 2b), and so on to each next CAM block (e.g., 201-3, ... 201-j in FIG. 2b) to initialize all the CAM blocks (e.g., 201-1 to 201-j in FIG. 2b) within the CAM cascade.

Figure 2B:
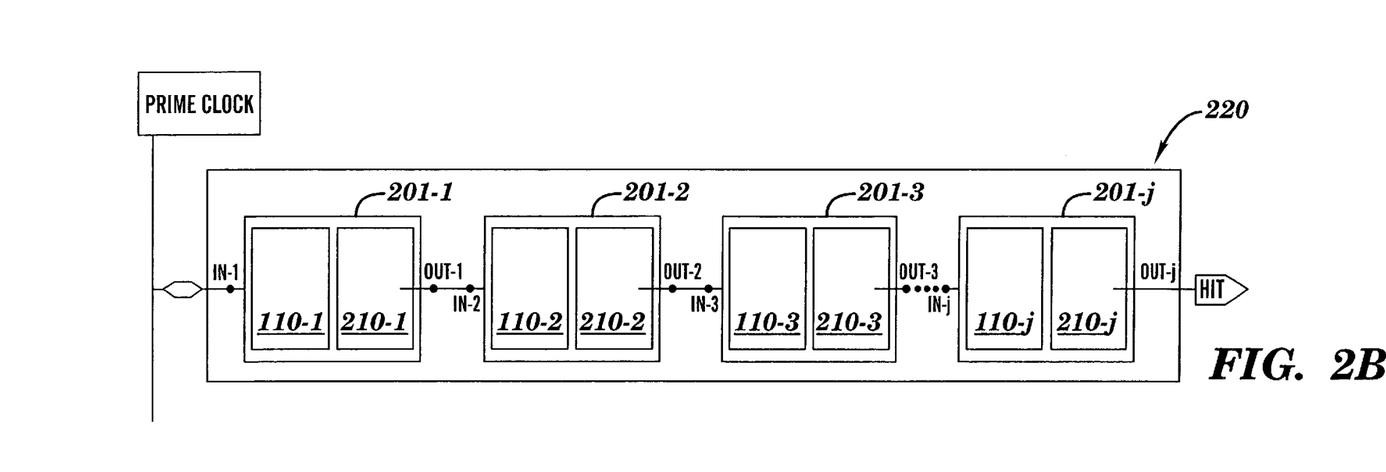
FIG. 2b depicts a CAM cascade comprised of a plurality of the generic CAM blocks of FIG. 2a operatively connected in a cascading manner so that the output of each CAM block is the search-enabling input of the next, and the output of the last CAM block is the logical Hit output of the entire included CAM entry.

The function and operation of a generic CAM block 201 as shown in FIG. 2a, and the operation of all the various species of the inventive CAM block 201 may be better understood in the context of the plurality j (where j is an integer) of serially-connected CAM blocks (e.g., 201-1, 201-2, 201-3, . . . 201-j) which form the generic CAM cascade 220 depicted in FIG. 2b. Each CAM block 201 (e.g., 201-1, 201-2, 201-3, . . . 201-j) contains a subset of the W CAM cells in the CAM entry. More specifically a given CAM block contains $X_i$ (where $X_i$ is an integer) CAM cells 102 of the CAM entry (e.g., CAM cells 102-1, 102-2, 102-3, 102-$X_i$; where $X_i$ is the number of CAM cells in the $i^{th}$ CAM sub-entry among the j sub-entries in the CAM cascade, and $i^{th}$ is an integer between 1 and j inclusive). The entire CAM cascade 220 will contain all W of the CAM cells of the subdivided CAM entry.

In some embodiments of the invention, for a CAM entry having a total of W CAM cells 102 (corresponding to a stored data word having W bits) each CAM block among the j cascaded CAM blocks may contain an equal number (i.e., X=W/j) of CAM cells 102. Alternatively, in some embodiments certain CAM blocks (e.g., the first and/or last) may contain fewer or more CAM cells 102 than the average number (i.e., W/j) of CAM cells per CAM block. Each of the CAM cells 102 within the inventive CAM blocks may be a binary CAM cell such as 101 in FIG. 1 or a Ternary CAM cell, or any other known CAM cell type that can be adapted to have a pass-gate disposed between a Match Line and a Search Enable (SE) line (e.g., Binary/Ternary/Global-Masking CAM cells; SRAM/DRAM CAM cells; NFET/PFET CAM cells).

Figure 3:
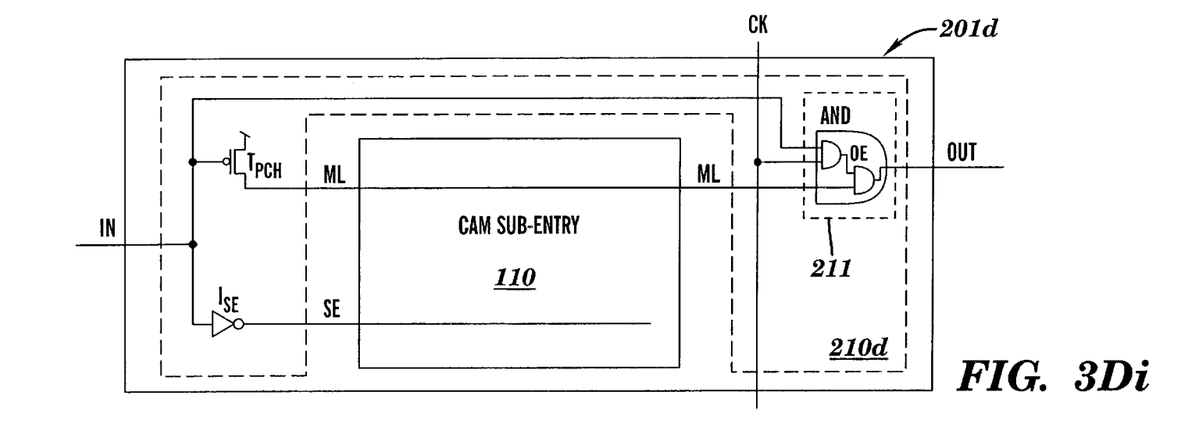

Each CAM block 201 has a binary logic input node/line IN and a binary logic output node/line OUT. The output node/line OUT of each CAM Block 201 (e.g., 201-1, 201-2, 201-3, . . . 201-j-minus-one) is wired to the input node/line IN of each next CAM BLOCK 201 (e.g., 201-2, 201-3, . . . 201-j respectively) within the same CAM cascade 220. The input node/line IN-1 of the first CAM block 201-1 of the CAM cascade 220 is the Prime Clock input node/line of the entire CAM cascade 220. The input node/line IN-1 of the first CAM block 201-1 of each of a plurality of CAM cascades 220 provided within a CAM array may be wired to a common Prime Clock line (as shown in FIGS. 2b and 3dii), and all CAM Cascades in the CAM array may be thereby initialized and activated synchronously.

The output node/line OUT-j of the last CAM block 201-j of the CAM cascade 220 (see FIG. 2b)is the logical HIT output node/line of the entire CAM cascade 220. The HIT output node/line signal of the CAM cascade 220, when sampled at the appropriate time, is the logical equivalent of a single Match Line if wired directly to all of the CAM cells (i.e., the entire CAM entry) within the entire CAM cascade 220 (see FIG. 2b) as in accordance with the CAM entry design of the related art.

Figure 3A:
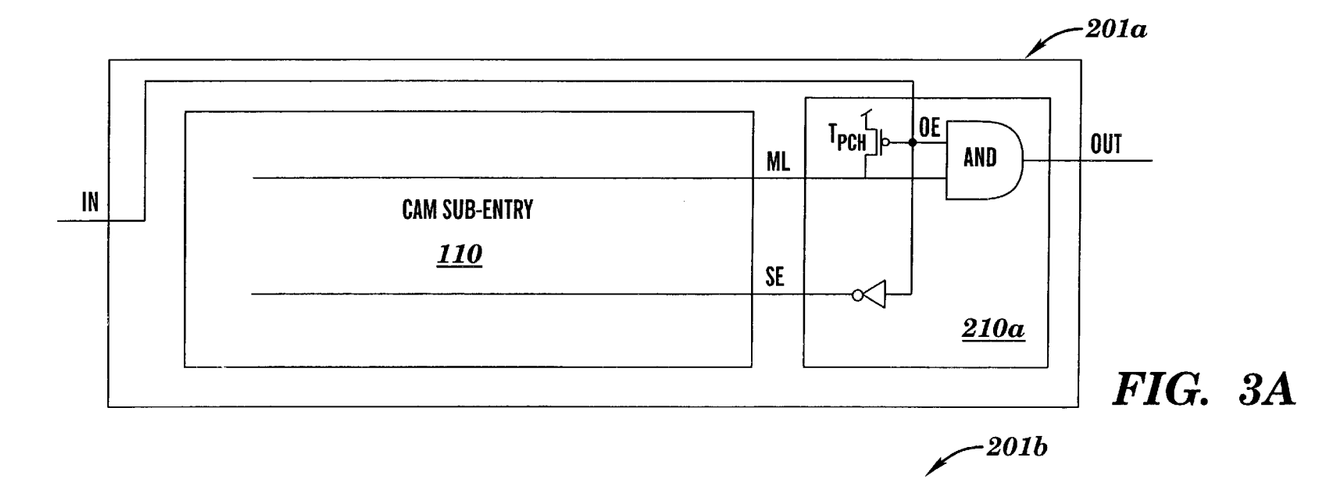
FIG. 3a depicts a circuit diagram of a first alternative CAM block including a Match-Line gating circuit that enables the output of the block immediately after a CAM search comparison has been enabled, for use in a first, second or more of the CAM blocks of the CAM cascade of FIG. 2b.
Figure 3B:
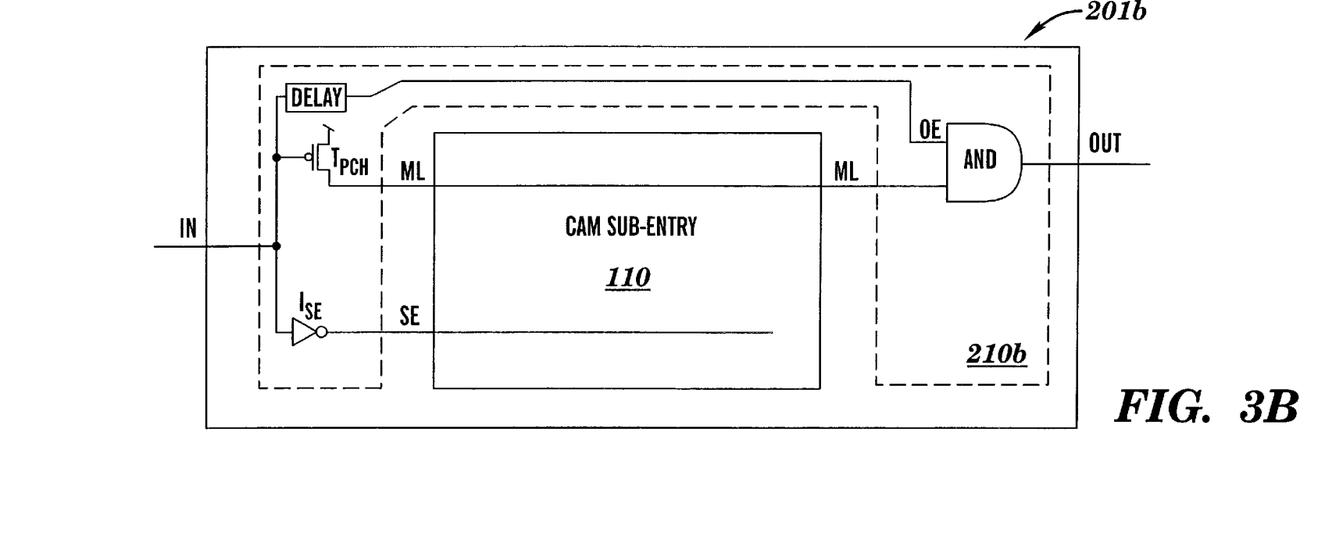
FIG. 3b depicts a circuit diagram of a second alternative CAM block, having a Match-Line gating circuit including an output-delaying time delay, for use in one or more of the CAM blocks of the CAM cascade of FIG. 2b.
Figure 3C:
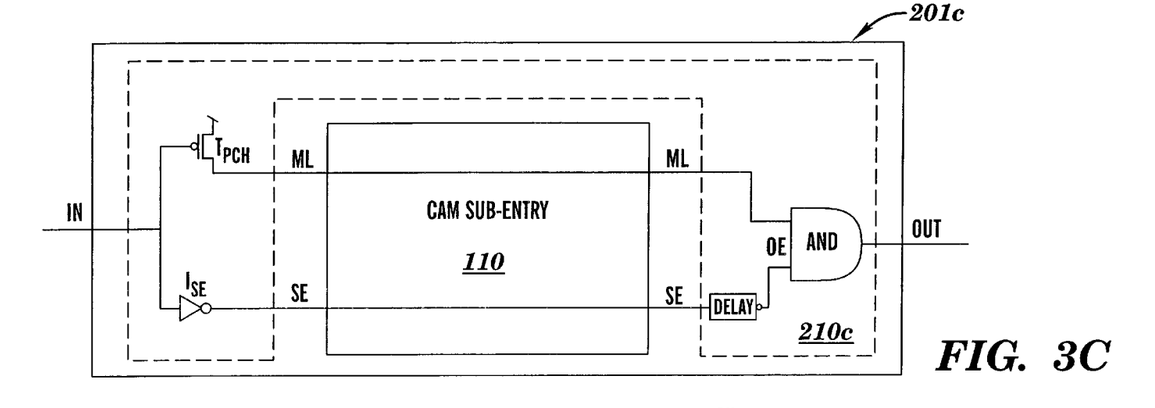
FIG. 3c depicts a circuit diagram of a functional equivalent of the CAM block depicted in FIG. 3b, having a Match-Line gating circuit including an output-delaying time delay, for use in one or more of the CAM blocks of the CAM cascade of FIG. 2b.
Figure 3E:
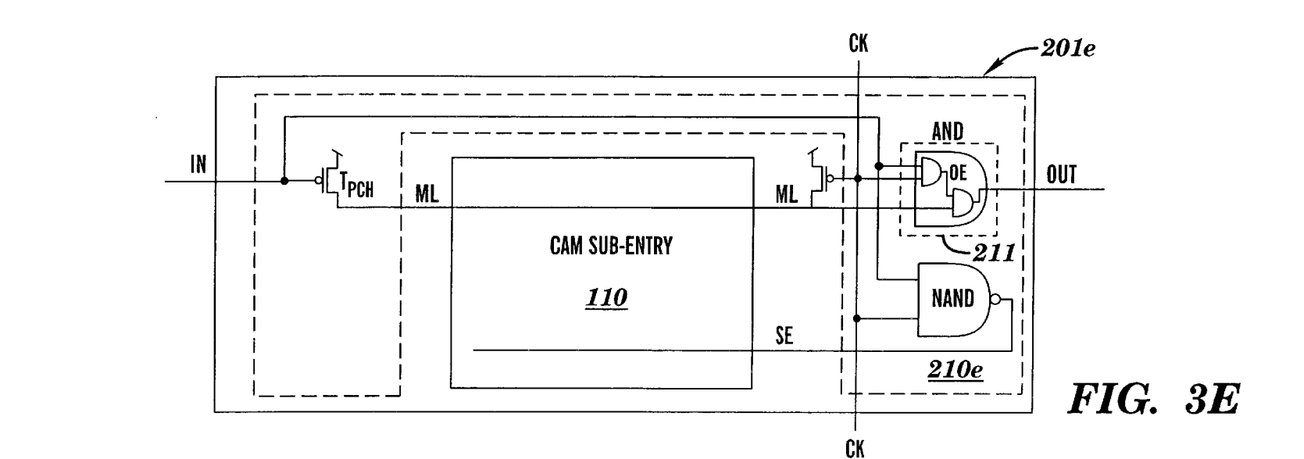
FIG. 3e depicts a circuit diagram of a fourth alternative CAM block having its output and its CAM comparison function enabled by the block's input and by an external clock signal, for use as one or more of the CAM blocks of each CAM cascade in FIGS. 2b or 3dii.
Figure 3F:
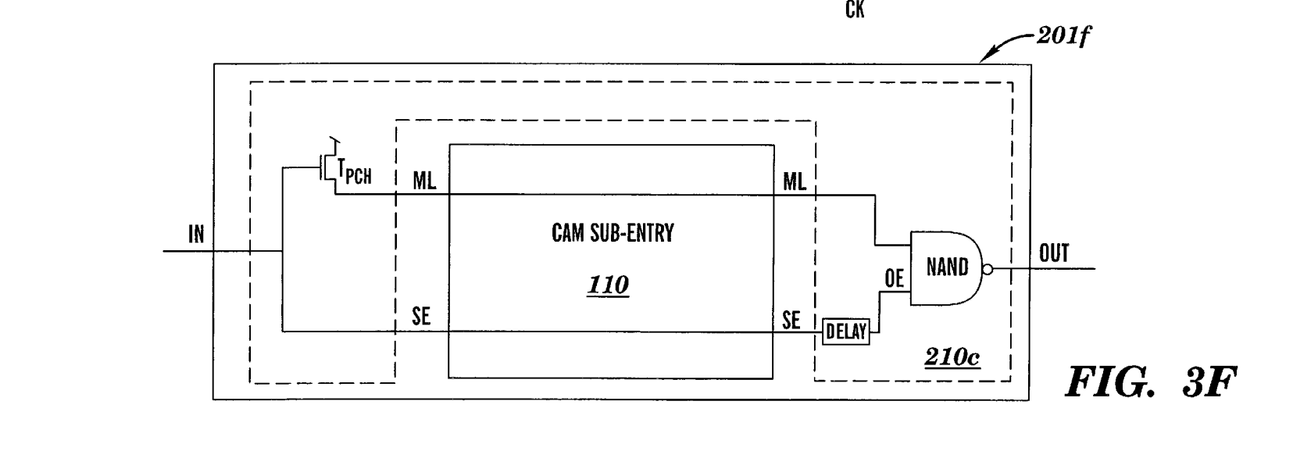
FIG. 3f depicts a circuit diagram of a variation of the CAM block shown in FIG. 3c, wherein the Match Line pre-charge transistor is an NFET, for use in one or more of the CAM blocks of the CAM cascade of FIG. 2b.

The input IN of each CAM block 201 controls the voltage level on the Search Enable (SE) line segment of the included CAM sub-entry 110 (e.g, through an inverter $I_{SE}$ as shown in FIGS. 2a, 3a, 3b, 3c, and 3di; and through a NAND gate operating as an inverter in FIG. 3e). When the Search Enable (SE) line segment of a CAM block 201 is held at a logic High voltage level (i.e., when the block's input IN is at a logic Low voltage level), the match line segment (ML) of the CAM sub-entry 110 cannot discharge to ground (i.e., to a logic Low voltage level) through the Match Line Pass Gate (i.e, through the legs of the XNOR function in each CAM cell 102) even if all bits of the word stored in that sub-entry are mismatched with respect to the respective bits of the comparand. When the input IN of the block 201 is at a logic Low voltage level, the match line segment (ML) of the sub-entry 110 in the block 201 is being pre-charged High and held at a logic High voltage level through a pre-charge Transistor (e.g., P-Type transistor $T_{PCH}$ as shown in FIGS. 2a, 3a, 3b, 3c, 3di, and 3e; or N-Type transistor $T_{PCH}$ as shown in FIG. 3f). (In alternative embodiments not shown, each match line precharging transistor $T_{PCH}$ may instead be controlled by an external line that may be directly connected to the gate of the precharge transistor, or indirectly coupled to the gate of the same or of a second precharge transistor). Conversely, when the input IN of a CAM block 201 is held at a logic High voltage level, (and consequently the Search Enable (SE) line segment is held Low), the CAM sub-entry's comparison function is enabled and the match line segment of the sub-entry 110 will drop towards ground (i.e., the voltage on SE) or remain high depending upon whether the data bits stored in the sub-entry 110 mismatch or match the respective bits of the comparand.

The binary output OUT of a generic CAM block 201 (including a plurality of species of CAM block 201 including 201a, 201b, 201c, 201d, 201e in FIGS. 3a, 3b, 3c, 3di, and 3e) is the logical AND of the match line segment (ML) voltage and of the Output Enable (OE) node/line voltage as shown in the generic gating circuit 210 in FIG. 2a. Accordingly, when the Output Enable (OE) line/node within the gating circuit 210 is at a High logic voltage level, the output OUT of the CAM block 201 will be the logic value of the match line (ML) segment of the sub-entry 110 within that CAM block 201.

Therefore, if the output is enabled (i.e., OE held High) after an appropriate time period (i.e., the Matchline Delay period $T_{MD}$) after the Search Enable (SE) line segment is dropped Low, the output OUT of a CAM block 201 will be the true logic state of the Match Line Pass Gate of the included sub-entry 110 (detected as the voltage of the match line segment ML): High in the case of a MATCH-ing sub-entry; Low in the case of a MISS-ing (i.e., mismatched) sub-entry. The appropriate (delay) interval $T_{MD}$ is not less than the maximum time period that it may take for the match line segment (ML) of a sub-entry storing a mis-matched data word to fall during a CAM search comparison from its pre-charged logic High voltage level to a reliably detectable logic Low voltage level. As explained herein below, this maximum fall time is characterized by the fall time of the match line (ML) segment of sub-entry containing a single bit mis-match. This maximum fall time may be calculated from the Match Line Capacitance ($C_{ML}$) of the match line segment (ML) of the sub-entry 110 and the resistance (R) of one conducting transistor stack in the Match Line Pass-Gate of the sub-entry, or it may determined during software simulation as is well understood in the art.

As will be more thoroughly explained below, the output enable (OE) line/node within a Match-Line gating circuit 210 may be time-controlled in a variety of manners in various specific alternative embodiments of the invention: For example, as in a first embodiment 210a depicted in FIG. 3a the Output Enable (OE) line/node may be wired directly to the Input IN line; or as in a second embodiment the Output Enable (OE) line/node may be driven by the input IN line through a delay. The delay may be implemented as a series of long-channel inverters. The delay may be driven directly by the input line IN (as shown in gating circuits 210b and 210f of FIGS. 3b and 3f) or directly by the search enabling inverter $I_{SE}$ (as shown gating circuit 210c in FIG. 3c); or, as in a third embodiment, the Output Enable (OE) line/node of each gating circuit 210 (e.g., 210d-1, 210d-2, 210d-3, . . . 210d-j as shown in FIG. 3dii) in each of N CAM cascades 220 of a CAM array may be wired to an external Clock signal CK line (e.g., CK-1, CK-2, CK-3, . . . CK-j) as depicted in FIG. 3dii. Additional alternative embodiments having various other internal or external clocking and output enable (OE) control schemes are within the scope of the disclosed invention and appended claims.

Many embodiments of the inventive CAM block 201 (e.g., those that include gating circuits 210b, 210c, 210d, 210e and 210f shown in FIGS. 3b, 3c , 3di, 3e, and 3f respectively) support a feature that can reduce the energy consumption of CAM searches in wide CAM arrays. This energy savings is accomplished by enabling a CAM search comparison within the first CAM block 201-1 of each CAM cascade 220 (see FIG. 2b) and within only those subsequent CAM blocks (e.g., 201-2, 201-2, . . . 201-j) whose inputs (e.g, IN-2, IN-3, . . . IN-j) are connected to the output (e.g., OUT-1, OUT-2 . . . ) of a previous CAM block (e.g., 201-1, 201-2 . . . ) whose included sub-entry (e.g., 110-1, 110-2 . . . ) contains MATCH-ing data compared to the comparand. Thus, if the sub-entry 110 of a first or a subsequent CAM block 201 contains mismatching data, the contents of the sub-entry 110 of the next and subsequent CAM block(s) will not be evaluated and therefore its match line (ML) segment will not be discharged to a Low voltage level. This is a consequence of the feature of embodiments that the AND-gated output OUT of each CAM block 201 in a CAM cascade 220 will enable or disable the CAM search operation within each next CAM block 201 in the same CAM cascade 220. In embodiments where the output enable (OE) node/line. of a CAM block 201 is activated (raised to a logic High voltage level) only after the match line (ML) segment contained in the block 201 has had sufficient time (e.g., $T_{MD}$) to fall to a Low voltage level (as it will in the case of a mismatch of data stored in the block's sub-entry 110), the binary output OUT of that CAM block 201 will at that time represent the logic state of the Match Line Pass-Gate of the included CAM sub-entry 110 (i.e.: High (non-conducting) for a MATCH-ing sub-entry; Low (conducting) for a MISS-ing sub-entry). Thus, subsequent CAM blocks 201 in a given CAM cascade 220 will only be enabled (i.e. will only sense a search-enabling High voltage level on their input IN line) when all previous CAM blocks 201 in that cascade 220 contain MATCH-ing sub-entries. Accordingly, CAM search comparison having the potential to discharge a match line (ML) segment will only be enabled in those CAM blocks 201 of those CAM cascades 220 which may possibly contain a MATCH-ing entry based upon the result of a CAM comparison performed on the sub-entry of the previous CAM block(s). By preventing (not enabling) the discharge of the match line capacitance ($C_{ML}$) of match line (ML) segments of the sub-entries in CAM cascades 220 that have been found to contain mismatching data words (based upon the contents of the first or any prior CAM block in the that cascade), significant energy conservation can be achieved.

Higher search speed, with significant Match Line energy conservation, can also be achieved by constructing each CAM cascade 220 in the CAM array with at least the first block (201-1, see FIG. 2b) being a power-saving type CAM block (e.g., a CAM block including one of gating circuits 210b, 210c, 210d, 210e or 210f as shown in FIGS. 3b, 3c, 3di, 3e, and 3f respectively). Power saving blocks may also be employed as the first 201-1 and second 201-2 or more blocks of each CAM cascade 220 that employs a plurality of faster CAM blocks (e.g., a CAM block including the gating circuit 210a as shown in FIG. 3a) for the remaining CAM blocks (e.g., 201-3 . . . 201-j) of the CAM cascade. In this mixed-block configuration, a CAM search comparison will be simultaneously performed in every first CAM block 201-1 in the CAM array (i.e. in the sub-entry of every first CAM block of every CAM cascade 220 in the CAM array) when the Prime Clock signal is asserted High at the input (IN) line of every such first CAM block 201-1. However, no CAM search comparison will be performed in the subsequent CAM blocks (e.g., 201-2, 201-3, . . . 201-j) of those CAM cascades whose first CAM block 201-1 contains a mismatching sub-entry. In other words, after a CAM search comparison has been performed in the sub-entries of all the first CAM blocks 201-1 of the CAM array, CAM search comparisons will only be performed in CAM cascades 220 whose first CAM block 201-1 contains a MATCH-ing sub-entry relative to the asserted comparand. The sub-entry 110-1 of the first CAM block 201-1 (i.e., the power saving block) may contain more bits or fewer bits of the CAM cascade's entry's data word than the number of bits present in each of the subsequent CAM blocks of that cascade 220. Up to a point, the more bits that the first sub-entry 110-1 contains, the more energy that has been stored in the capacitances of the subsequent match line (ML) segments in the CAM array can be conserved during the operation of the CAM array; the fewer bits the first sub-entry 110-1 contains, the faster the first (power-saving) CAM block 201-1 can operate. The interval of an included Delay element (as in gating circuit 210b, 210c or 210f as shown in FIGS. 3b, 3c and 3f respectively) or the timing of the external clock signal CK-1 (as in gating circuits 210d and 210e as shown in FIGS. 3di, and 3e respectively) that controls the output enable (OE)

of the first CAM block 201-1 can be fine-tuned to optimize performance speed. The time interval between the raising of the input (IN) line (which activates the search enable (SE) line segment) and the raising of the output enable (which samples the Match Line voltage and asserts its logic value at the block's output OUT) can be tuned (e.g., minimized) so that the output OUT of the first block 201-1 will assert the logical result of the CAM comparison of the first CAM block 201-1 in each CAM cascade 220 as soon as the first sub-entry's (110-1) Match Line voltage (the voltage on the sub-entry's match line (ML) segment) will reliably indicate the logical result of the CAM comparison within the first-block 201-1. This appropriate time for raising the output enable (OE) line/node may be immediately after the match line (ML) segment of the first 201-1 block's sub-entry 110-1 has had sufficient time to discharge to a Low voltage in the case of a single-bit mismatch in the sub-entry 110-1).

The probability of a mismatch in the sub-entry 110-1 of the first CAM block 201-1 of each CAM cascade 220 (see FIG. 2b) in a CAM array is $1(\frac{1}{2})^P$ where P is the number of bits of the data word that are stored in the first (e.g., power-savings) block 201-1 (i.e., $P=X_i$; where i=1). (This probability assumes that each data bit stored in the sub-entry of the first CAM block 201-1 is independent of each other stored bit and that such bits are random. This probability can be increased by assigning the statistically or predicted least-matching bits of the stored data words to the first sub-entry 110-1.) For example, with P=4 (i.e., the sub-entry of the first CAM block 201-1 of each CAM cascade 220 contains four data bits out of the W data bits in the entire CAM entry/cascade 220), the probability of a mismatch within the first sub-entries in the CAM array is 15/16. In that case, 15 out of every 16 CAM cascades (i.e, 15 out of 16 CAM entries) in the CAM array will immediately mismatch, and only one out of 16 will match. In those 15 out of 16 CAM cascades 220 whose first CAM block 201-1 mismatches, the remaining CAM blocks (e.g., 201-2, 201-3, . . . 201-j) will not be enabled since the input IN line of each subsequent CAM block (e.g., 201-2, 201-3, . . . 201-j) will remain at the initial Low voltage level. Therefore, no subsequent match line (ML) segments within those 15 out of 16 CAM cascades will be discharged from the precharged High voltage.

The energy savings potential of this CAM array design can be illustrated in the example of a CAM array having 1,048,576 (i.e, 2^20) CAM entries (i.e., N=1,048,576; for an array containing 1,048,576 CAM cascades 220), each CAM entry storing 1,024 data bits (i.e., W=1,024), each CAM entry being subdivided into 64 sub-entries (i.e., j=64) each sub-entry (including the first sub-entry) storing an equal number (P=X=16) of bits. The probability of a mismatch in the first CAM block 201-1 (i.e, the power savings block) is 1-(1/65536). This probability of a mismatch in the first CAM block 201-1 is more than 99.99 percent, representing 1,048,560 out of 1,048,576 entries. Thus, in 1,048,560 out of the 1,048,576 CAM cascades 220, a CAM comparison will only be performed upon the first (16-bit) CAM sub-entry 110-1 (i.e, within the first CAM block 201-1) and accordingly no match line (ML) segment will discharge during that CAM search within the subsequent CAM blocks (e.g., 201-2, 201-3, . . . 201-64) of those 1,048,560 mismatching CAM cascades 220. Thus, a CAM array that is 1M long by 1024-bit wide constructed and operated in accordance with embodiments of the present invention can perform a CAM search that consumes a match line capacitance ($C_{ML}$) discharge energy on the order of that of a 1M by 16-bit wide CAM array of the related art. The power efficiency relative to the width of the CAM array increases as the CAM entries get wider, and/or as the first sub-entry 110-1 of each CAM cascade gets wider.

Power consumption of such an inventive CAM array can be further reduced by utilizing power-saving type CAM blocks (e.g., a CAM block including one of gating circuits 210b, 210c, 210d, 210e or 210f as shown in FIGS. 3b, 3c, 3di, 3e, and 3f respectively) as the second block 201-2 and third block 201-3 etc. (in addition to the first block 201-1) of each CAM cascade 220.

Power savings over the CAM arrays of the related art can be realized because the operation of CAM cascades 220 comprising the inventive CAM block architecture (see generic CAM block 201) does not require that the Search Lines (e.g., SLT and SLC in each CAM cell 102) coupled to sub-entries (e.g., 110-1, 110-2, 110-3, 110-j) be returned to any particular logic voltage level at the end of each CAM search comparison. During each CAM search cycle, (and prior to the search enable SE line segment falling Low) the search lines (e.g., SLT and SLC) will be fixed and at least one of the search lines of each CAM cell 102 in every sub-entry 110 being evaluated will be fixed at a logic High voltage level. Regardless of the state of any or all of the search lines of the sub-entry 110 following a CAM search comparison, the match line (ML) segment of the sub-entry 110 can be initialized (i.e., pre-charged to a logic High voltage level) while its search enable (SE) line segment is held at a logic High voltage level; and after such initialization a pre-charged match line (ML) segment at a logic High voltage level will not be discharged until the search enable (SE) line segment drops to a logic Low voltage level. Thus, in embodiments of the present invention, the search lines (e.g., SLT and SLC) can be left unchanged at the end of each CAM search cycle. Thus, a particular search line will only be changed if the next comparand to be searched happens to require that it be changed. Thus, in a subsequent CAM search cycle, if a given bit of the comparand does not change (relative to that bit of the comparand of the previous CAM search cycle), the search line corresponding to that particular bit does not change, and that search line may continue to stay in its previous state. The search lines (e.g., SLT and SLC) may also be used for other purposes when no CAM comparison is being performed (e.g., as bit-lines BLC and BLT for reading and writing data to the memory storage cell(s) 104 of the CAM cells 101) without discharging the match line segments.

FIG. 3a depicts a circuit diagram of a fast CAM block 201a including a match-line gating circuit 210a that enables the output OUT of the CAM block 201a immediately when a CAM search comparison is enabled by the raising of the CAM block's input IN to a logic High voltage. CAM block 201a may be used as a first (201-1), second (201-2) or subsequent CAM blocks (e.g., 201-3 . . . 201-j) of a CAM cascade 220 as depicted in FIG. 2b. CAM cascades 220 (see FIG. 2b) constructed in accordance with embodiments of the invention can be optimized for maximal CAM search speed or frequency by employing the gating circuit 210a of FIG. 3a in all CAM blocks (e.g., 201a-1, 201a-2, 201a-3, . . . 201a-j) of every CAM cascade 220 (see FIG. 2b) in a CAM array. Every CAM block 201a in such a fast CAM cascade will be enabled (i.e., the Search Enable (SE) line segment therein will be lowered to a Low voltage) soon after the input IN node/line of the first CAM block 201a-1 has been raised to a logic High voltage level. This is because the logic High voltage level asserted on the input IN line of the first CAM block will immediately (within a relatively short propagation time period $T_{PD}$) propagate through that first CAM block to the input IN node/line of the next CAM block, and so forth to the input IN node/line of the last CAM block. Accordingly, the HIT output of each such fast CAM cascade 220 (i.e., the output OUT line/node of last CAM block 201*a*-j) will reliably assert the logical result of the CAM search comparison performed on the entire included CAM entry a short time after the match line (ML) segment of the first CAM block 201*a*-1 has had a sufficient time (e.g., $T_{MD}$) to fall to a Low voltage level in the case of a mismatch therein. This relatively short time is approximately equal to the sum of the propagation time $T_{PD}$ through each of the next j–1 CAM blocks 201*a* (e.g., (j–1)*($T_{PD}$)) plus a sufficient time $T_{MD}$ required for the match line segment in one CAM block 201A to fall to a Low voltage level in the case of a mismatch therein. In wide CAM cascades (storing W bits), this time ($T_{MD}$+(j–1)*($T_{PD}$)) will be significantly shorter (i.e., faster) than that required for a single match line of a CAM entry of the same width (W) constructed in accordance with the related art to fall during a CAM search in the event of a mismatching entry storing a single mismatching bit. The CAM search time savings achievable with the inventive CAM cascade 220 (compared to the single match line CAM entries of the related art) tends to increase as the width W of data words stored in the CAM entries to be searched is increased.

Experimental results derived from computer simulations of binary CAM circuits constructed of the same CAM cells 101 (see FIG. 1) operating at the same supply voltage, include the following data and comparisons between CAM search times for: #1) a single-match-line CAM entry storing W binary bits and constructed in accordance with the related art; and #2) a fast CAM cascade storing W binary bits and constructed with 32 bits per block in accordance with the disclosed embodiments of the invention:

TABLE 1

| | Search Time (Ns) | | |
|---|---|---|---|
| W Bits/Entry | Time #1 [from 50% SLC/T] [to 50% ML] | Time #2 [from % 50 IN-1] [to % 50 HIT] | Time saved [% of time #1] |
| 128 | 1.62 | 1.31 | 19% |
| 256 | 3.08 | 1.71 | 44% |
| 512 | 5.93 | 2.23 | 62% |

These results confirm that: searches in CAM arrays constructed in accordance with embodiments of the present invention can be performed at a higher CAM search frequency than that possible with single-match-line CAM arrays of the related art of the same width; and that this relative CAM search frequency advantage improves as the width W of data words stored in such CAM arrays is increased.

The match-line gating circuit 210*a* of CAM block 201*a* includes a P-FET transistor $T_{PCH}$ to precharge the match line (ML) segment within the CAM block 201*a* to a High voltage level upon initialization (i.e., when block input IN is held at a Low voltage level). The circuit 210*a* also includes a search-enabling inverter $I_{SE}$ coupled between the block's input IN and the search enable (SE) line segment, to provide the correct voltage polarity to the search enable (SE) line segment. Accordingly, when the Output Enable (OE) node of the logic gate AND is held at the output-enabling voltage level (e.g., OE is High), a search-enabling voltage level is asserted on the search enable (SE) line segment (e.g., SE is Low). Conversely, upon initialization, the Output Enable (OE) node of the logic gate AND will be held at the output-disabling voltage level (e.g., OE is Low) when the search enable (SE) line segment is held at a search-disabling voltage level (e.g., SE is High).

The search-enabling inverter $I_{SE}$ driving the search-enabling (SE) line segment may be formed by an NFET-PFET stack, or by any other equivalent inverting circuit known to persons in the art. In alternative embodiments, the inverter $I_{SE}$ and an inverter internal to the AND gate of FIG. 3*a* may be eliminated as in the alternative embodiment shown in FIG. 3*f*. By using a NAND-gate instead of the AND-gate, and implementing the pre-charge transistor $T_{PCH}$ as an NFET, the precharged High voltage level on the match line segment (ML) may be reduced below the full supply voltage (Vcc) which in turn may further reduce energy consumption of embodiments of the inventive CAM array.

FIG. 3*b* depicts a circuit diagram of a CAM block 201*b* that can be employed in inventive CAM cascades 220 (see FIG. 2*b*) for power-savings, as already described above. In contrast with circuit 210*a* of FIG. 3*a*, the circuit 210*b* of FIG. 3*b* includes a delay block DELAY disposed between the block input IN node/line and the output enable (OE) node of the logic gate AND. The DELAY block in circuit 201*b* is a non-inverting delay. The DELAY block is provided to enable the CAM block 201*b* to assert the match line (ML) segment's logic state resulting from a CAM comparison of the sub-entry in block 201*b* (e.g., ML will remain High in the case of a matching sub-entry) through the block's output OUT after a certain period of propagation delay time $T_D$ has elapsed after the block's input IN node/line has been raised to a block-enabling voltage level (e.g., after IN is raised High). The block-enabling voltage level (e.g., high) asserted on block input IN will be inverted by search enabling inverter $I_{SE}$ to lower the voltage on the search enable (SE) line segment to a search-enabling logic voltage (e.g., SE dropped to a Low voltage level) which will allow the match line (ML) segment to fall to the same Low voltage if the sub-entry 110 contained within the block 201*b* stores mismatching data. If the non-inverting DELAY block's propagation delay time period $T_D$ is not less than the time $T_{MD}$, then the CAM block's output OUT line will rise to a High voltage level if and only if the CAM block 201*b* contains a matching sub-entry with respect to the comparand then being asserted. Therefore, a second CAM block 201*b*-2 whose input IN-2 is connected to the output OUT-1 of a first CAM block 201*b*-1 will be enabled only in the event that the sub-entry 110 of the first CAM block 201*b*-1 stores matching data. Consequently, if the sub-entry 110 of the first CAM block 201*b*-1 stores mismatching data (indicating a MISSing entry), no match line (ML) segments in subsequent CAM blocks (e.g., 201*b*-2, 201*b*-3, . . . 201*b*-j) in the same CAM cascade 220 (see FIG. 2*b*) will be discharged. Thus, CAM block 201*b* may be used for energy conservation as a first (201-1), second (201-2) or subsequent CAM blocks (e.g., 201-3 . . . 201-j) of a CAM cascade 220 as depicted in FIG. 2*b*.

FIG. 3*c* depicts a circuit diagram of a CAM block 201*c*, for use as one or more of the CAM blocks 201 of the CAM cascade 220 of FIG. 2*b*, that is a functional equivalent of the CAM block 201*b* depicted in FIG. 3*b*. CAM block 201*c* has a Match-Line gating circuit 210*c* that includes an inverting DELAY block disposed between the search enable (SE) line segment of the sub-entry 110 and the output enable (OE) node of the AND-gate. The inverting DELAY block of circuit 210*c* may have a shorter propagation delay period $T_D$ than that of the non-inverting DELAY block of circuit 210*b*, because the inverter $I_{SE}$ in circuit 210*c* will have a finite propagation delay and also because the voltage on the capacitative SE line segment in block 201c will have a greater fall time than the rise time of the voltage on the block's input IN line. In some embodiments of the invention, the inverting DELAY block of circuit 201c may be implemented as a single inverter, such as for example a long-channel CMOS inverter.

FIG. 3di depicts a circuit diagram of a CAM block 201d wherein the match line (ML) segment's logic voltage is asserted as the block's output OUT at a time controlled by an external clock signal CK. CAM block 201d may be used for energy conservation as a first (201-1), second (201-2) or subsequent CAM blocks (e.g., 201-3 . . . 201-j) of a CAM cascade 220 as depicted in FIG. 2b, if the assertion of an output-enabling voltage (i.e., High) on the clock signal CK line is appropriately delayed relative to an assertion of a search-enabling voltage (i.e., High) on the block's input IN line. Alternatively, the CAM block 201d may be used as fast CAM block (i.e., functionally equivalent to CAM block 201a) if an output-enabling voltage (i.e., High) is asserted on the clock signal CK line simultaneously with or immediately after an assertion of a search-enabling voltage (i.e., High) on the block's input IN line. Thus, the block 201d, and a plurality of blocks 201d in a CAM array, may be configured and dynamically controlled to operate as either fast CAM blocks (i.e., like block 201a) or as power-saving blocks (i.e., like blocks 201b and 201c).

FIG. 3dii depicts a circuit diagram of a CAM array 330 comprised of a plurality of CAM cascades (e.g., 220-1, . . . 220-3, 200-N) each comprising a plurality of the CAM blocks 201d of FIG. 3di and sharing a plurality of external clock signal CK lines (CK-1, CK-2, . . . CK-j). The plurality of first CAM blocks 201d-1 of the plurality of CAM cascades 220 is arranged in a first column, and share a first clock line CK-1 and may also share bit lines and search lines (not shown). Similarly, the plurality of second CAM blocks 201d-2 of the plurality of CAM cascades 220 is arranged in a second column, and share a second clock line CK-2 and may also share bit lines and search lines (not shown).

Each clock signal CK (e.g., CK-1, CK-2, . . . CK-j) may be asserted by a separate clock signal generator (e.g., CLOCK-1, CLOCK-2, . . . CLOCK-j respectively). Each clock signal generator (e.g., CLOCK-1, CLOCK-2, . . . CLOCK-j) may be provided with a first connection (250) and second connection (e.g., 260-1, 260-2, 260-3, . . . 260-j) to the PRIME CLOCK. The PRIME CLOCK may be synchronous or asynchronous with the system clock (not shown). The first connection (250) may be a direct connection whereby all of the plurality of clock signal generators (e.g., CLOCK-1, CLOCK-2, . . . CLOCK-j) will receive a synchronous signal from the PRIME CLOCK. The second connection (e.g., 260-1, 260-2, 260-3, . . . 260-j) may be indirect connection to the PRIME CLOCK whereby each of the plurality of clock signal generators (e.g., CLOCK-1, CLOCK-2, . . .CLOCK-j) will sense a signal from the PRIME CLOCK at a different time. Each of the plurality of clock signal generators (e.g., CLOCK-1, CLOCK-2, . . . CLOCK-j) may be provided with a Power Savings Enable PSE input to control the timing mode of the clock signal CK asserted by each clock signal generator. Every CAM block 201d in a given column of CAM blocks (e.g., 201d-1 or 201d-2) in the array 330 will operate either as a fast CAM block (i.e., like block 201a) or as a power-saving CAM block (i.e., like block 201b or 201c) depending upon the binary logic state of the Power Savings Enable PSE input of the clock signal generator (e.g., CLOCK-1, CLOCK-2, . . . CLOCK-j) that supplies a clock signal CK (e.g., CK-1, CK-2, . . . CK-j) to that column of CAM blocks 201d. Each Power Savings Enable PSE input may be independently and/or dynamically switched from a fast-block mode to a power-savings-block mode and vice versa by a binary logic voltage signal asserted thereon by CAM array control circuitry (not shown). Thus, the CAM array 330 comprised of a plurality of CAM blocks 201d can be operated during each CAM search as either a fast-wide CAM array (e.g., with all columns of blocks configured to operate as fast blocks 201a), or as a power-saving wide CAM array (e.g., with all columns of blocks configured to operate as energy-saving blocks 201b or 201c) or as a fast wide CAM array with energy-saving features (e.g., with a first column of blocks or with a first and second column of blocks configured to operate as energy-saving blocks 201b or 201c and with all subsequent columns of blocks configured to operate as fast blocks 201a).

The external clock signal CK (e.g., CK-1, CK-2, . . . CK-j) lines provided to each CAM Block in the array lines also facilitate the simultaneous initialization of every CAM block in the array. Simultaneous initialization of every CAM block 201d in the array 330 may be performed by asserting a Low voltage simultaneously on every clock signal line (e.g., PRIME CLOCK and CK-1, CK-2, . . . CK-j). This simultaneous initialization may be performed in array 330 by dynamically setting the PSE input of every clock signal generator (e.g., CLOCK-1, CLOCK-2, . . . CLOCK-j) to configure all columns of blocks in the array 330 to operate (e.g., temporarily during initialization) as fast-blocks (i.e., like block 201a) while the PRIME CLOCK asserts a block-initializing Low voltage level.

FIG. 3e depicts a circuit diagram of a CAM block 201e that is adapted for use as one or more of the CAM blocks in every CAM cascade 220 in a CAM array having external clock signals CK as shown in FIG. 3dii. CAM block 201e has its output OUT and its internal CAM comparison function (i.e., search enable line segment SE) enabled jointly by both the block's input IN and by an external clock signal CK. The voltage on the search enabling (SE) line segment is also controlled by (i.e. gated by) the external clock signal CK. The circuit 210e facilitates the simultaneous initialization of every CAM block in an array such as array 330 in FIG. 3dii. Simultaneous initialization of an array 330 comprised of CAM block 201e may be performed somewhat faster than that of an array comprised of CAM block 201d, because the search enabling (SE) line segment is more directly controlled by the clock signal CK in circuit 201e.

FIG. 3f depicts a circuit diagram of CAM block 201f that is functionally similar to the CAM block 201c of FIG. 3c, for use as one or more of the CAM blocks 201 of the CAM cascade 220 of FIG. 2b. Whereas the signal IN in the CAM block 201c of FIG. 3c is active High, the signal IN in the CAM block 201f in FIG. 3f is active Low. Accordingly, the Match Line pre-charge transistor $T_{PCH}$ in block 201f is an NFET, whereas it is a PFET in block 201c of FIG. 3c. As previously noted, the design of block 201f eliminates the search enabling inverter $I_{SE}$ provided in block 201c of FIG. 3c, and replaces the AND-gate of block 201c with a more simply implemented NAND-gate.

Figure 4A:
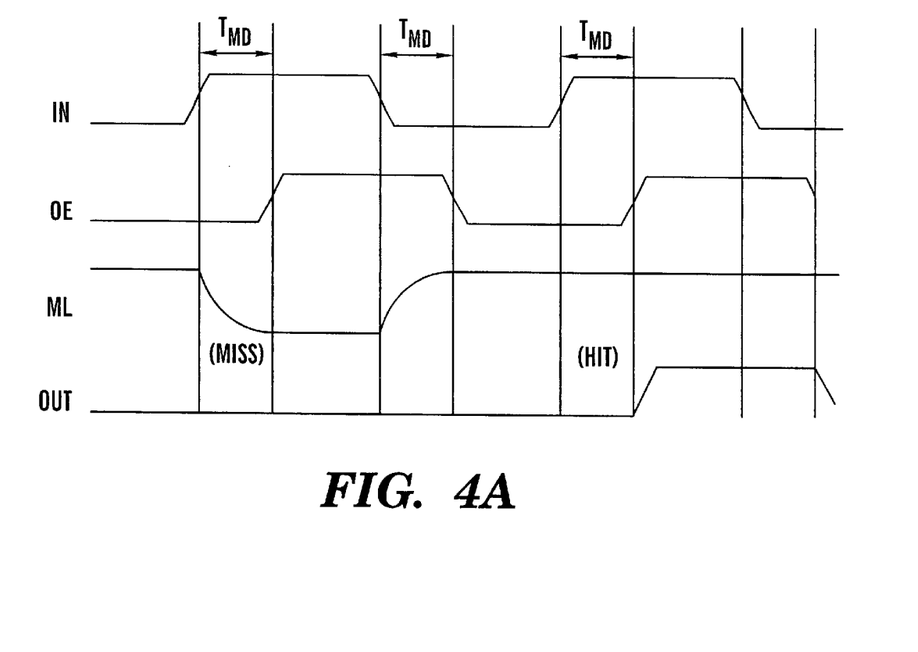
FIG. 4a depicts a timing diagram illustrating an exemplary timing relationship (delay) between the search-enabling input signal IN and the output-enabling signal at line OE in the CAM blocks depicted in FIGS. 3b and 3c.

FIG. 4a depicts a timing diagram illustrating an exemplary timing relationship (delay) between the search-enabling input signal IN and the output-enabling signal at line OE in the CAM blocks depicted in FIGS. 3b and 3c. The output enable (OE) node of the logic gate AND will rise and fall at a fixed time interval (or, in alternative embodiments, at two distinct fixed time intervals) determined by the propagation delay (or delays of rising and falling signals)

between the block input IN line and the output enable (OE) node. The signal propagation delay (for the signal, e.g., rising voltage on the OE node, that enables the output of the block) should be not less than $T_{MD}$ as previously defined herein as at least the period of time it takes for the match line of a sub-entry containing a single mis-matching bit to fall from the pre-charged High voltage level to a reliably detectable Low voltage level. The signal propagation delay $T_{ID}$ of a falling voltage that initializes the block and disables the block's output may be shortened to be less than $T_{MD}$ and minimized to accelerate block initialization.

Figure 4B:
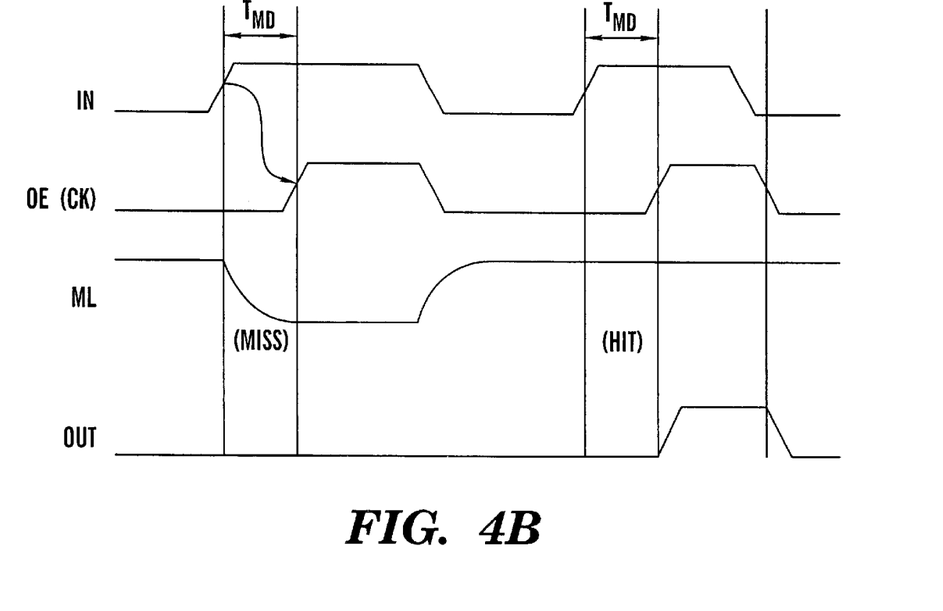
FIG. 4b depicts a timing diagram illustrating an exemplary timing relationship between the input signal IN and the external clock signal CK at the Output Enabling (OE) node in the gating circuit depicted in FIG. 3di.

FIG. 4b depicts a timing diagram illustrating an exemplary timing relationship between the input signal IN and the external clock signal CK at the Output Enabling (OE) node in the gating circuits 210d depicted in FIG. 3di. The block's output enable (OE) line should rise (thereby enabling the output) after an appropriate interval of time $T_{MD}$ after the rise of the block input IN line. However, the block's output enable (OE) line may fall to Low (thereby lowering the block's output OUT to re-initialize the next block 201d) immediately after the block's output OUT has had sufficient time to enable the next block in the event of High output due to a matching sub-entry. The OE line of a given block can go Low after that block's output OUT has enabled the next block's output for a sufficient time to enable the subsequent block's output, etc. or after a HIT output has been asserted (and sampled and latched).

Figure 5:
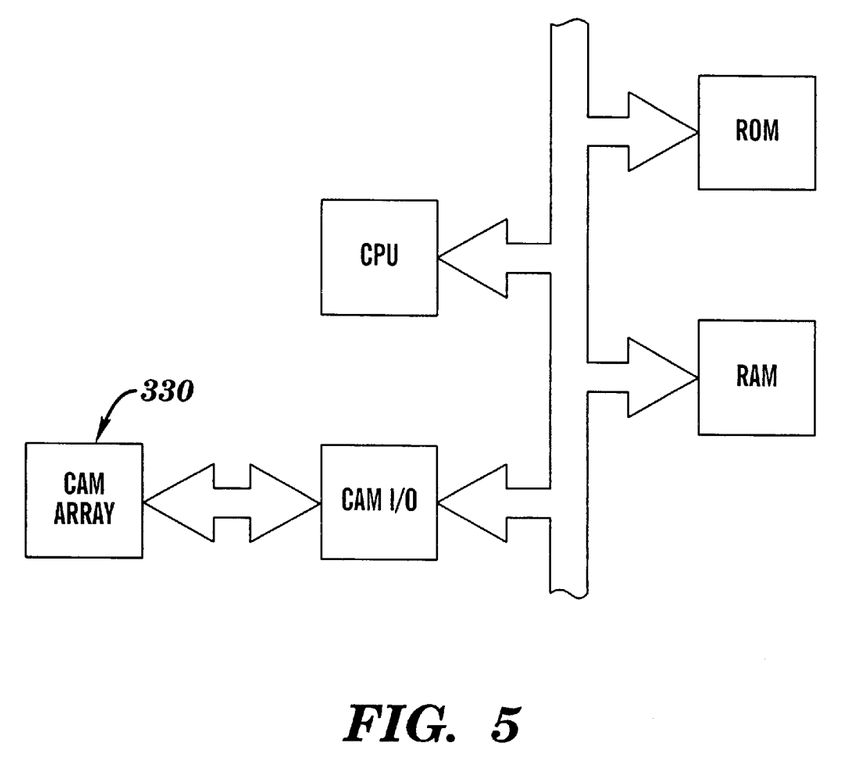
FIG. 5 depicts a representative digital system including a CAM array constructed in accordance with embodiments of the present invention.

FIG. 5 depicts a representative digital system including a CAM array (e.g., array 330 as shown in FIG. 3dii) constructed in accordance with embodiments of the present invention. The digital system may comprise a digital network router, or a parallel processing computer system.

Aspects of the present invention may also be embodied in ASIC libraries comprising inventive ASIC library elements having electrical rules that describe the inventive CAM blocks and/or the inventive match line gating circuits thereof. The electrical rules of the inventive ASIC library elements will list the devices (e.g., transistors, AND-gates, inverters) and describe the interconnections (e.g., the match line segment, and the search-enable line segment, the IN-OUT connection between two blocks) between such devices. The electrical rules of the ASIC library elements will be defined by the circuit diagrams depicted in FIGS. 2a, 2b, 3a, 3b, 3c, 3di, 3dii, 3e, 3f and 5. The electrical rules may be expressed in Electronic Design Interchange Format (EDIF). The inventive ASIC library elements may be used by persons skilled in the art to construct inventive CAM arrays having various entry widths, power requirements, and performance (e.g., search speed and/or search frequency) as described herein above.

While the invention has been particularly shown and described with reference to exemplary embodiments thereof, it will be understood by those skilled in the art that the foregoing and other variations in form, arrangement and details may be made therein without departing from the spirit and scope of the invention disclosed herein.

We claim:

1. A content addressable memory array comprising:
A plurality of CAM entries, each CAM entry being segmented into first, second and third sub-entries, each of the first, second and third sub-entries including a first, second and third match-line segment;
wherein the first match-line segment is operatively coupled to the second match-line segment through a first combinatorial logic gate, the second match-line segment is operatively coupled to the third match-line segment through a second combinatorial logic gate.

2. The array of claim 1, wherein the first combinatorial logic gate is an AND-gate having a first gate-input and a first gate-output.

3. The array of claim 2, wherein the first gate-input is the first match-line segment.

4. The array of claim 2, wherein each of the first, second and third sub-entries further includes a first, second and third search-enabling line segment, each search-enabling line segment adapted to prevent a discharge of a voltage on the first, second and third match-line segments, respectively.

5. The array of claim 4, wherein the second search-enabling line segment is the first gate-output.

6. The array of claim 5, wherein the third gate-input is the third match-line segment and the third search-enabling line segment is the second gate-output.

7. A method of performing a CAM comparison on a CAM entry having a first CAM cell and a second CAM cell, the method comprising:
providing a first CAM block including a binary first block input and a binary first block output, and further including the first CAM cell, the first CAM cell being operatively coupled to the first block input and to the first block output;
performing a CAM comparison on the first CAM cell only if a predetermined binary logic voltage level is asserted at the binary first block input;
asserting the predetermined binary logic voltage level at the first block output only if the predetermined binary logic voltage level is asserted at the binary first block input;
providing a second CAM block including a binary second block input and a binary second block output, and which includes the second CAM cell, the second CAM cell being operatively coupled between the second block input and to the second block output, the second block input being the first block output;
performing a CAM comparison on the second CAM cell only if the predetermined binary logic voltage level is asserted at the first block output.

8. The method of claim 7, further comprising asserting the predetermined binary logic voltage level at the second block output only if both the first CAM cell stores a bit that matches a first comparand bit and the second CAM cell stores a bit that matches a second comparand bit.

9. The method of claim 7, further comprising: asserting the predetermined binary logic voltage level at the first block output only if a CAM comparison has been performed on the first CAM cell.

10. The method of claim 9, further comprising: asserting the predetermined binary logic voltage level at the first block output only if the first CAM cell stores a bit that matches a comparand bit to be compared thereto.

11. The method of claim 10, wherein the CAM block further includes a first sub-entry including a first plurality of CAM cells including the first CAM cell, wherein the first block output will assert the predetermined binary logic voltage level only if the sub-entry is a MATCH-ing sub-entry.

12. The method of claim 11, wherein the predetermined binary logic voltage is a digital logic High voltage level.

13. The method of claim 11, wherein providing the first CAM block further includes coupling each CAM cell of the first plurality of CAM cells to a first match line segment, the first match line segment being a logic input of a first combinatorial logic gate, the first combinatorial logic gate having a binary first gate output, the binary first block output being driven by the first gate output.

14. The method of claim 13, wherein the first combinatorial logic gate is a logical AND-gate.

15. The method of claim 13, wherein the binary first block input is operatively coupled to another logic input of the first combinatorial logic gate.

16. The method of claim 8, further comprising: asserting the predetermined binary logic voltage level at the first block output only after a CAM comparison on the first CAM cell has been completed.

17. A method of performing a CAM comparison on a CAM entry, the method comprising:
  subdividing the CAM entry into a first sub-entry and a second sub-entry, each of the first and second sub-entries having at least one CAM cell;
  providing a first CAM block having a binary first block input and a binary first block output and including the first sub-entry;
  performing a CAM comparison on the first sub-entry only if a predetermined binary logic voltage level is being asserted at the binary first block input;
  asserting the predetermined binary logic voltage level at the first block output if the CAM comparison on the first sub-entry detects a MATCH-ing sub-entry; and
  providing a second CAM block having a binary second block input and a binary second block output, wherein the first block output is the second block input, and the second CAM block includes the second sub-entry;
  performing a CAM comparison on the second sub-entry only if the predetermined binary logic voltage level is being asserted at the binary second block input;
  asserting the predetermined binary logic voltage level at the second block output if the CAM comparison on the second sub-entry detects a MATCH-ing sub-entry.

18. The method of claim 17, further comprising asserting the predetermined binary logic voltage level at the first block output only if the CAM comparison on the first sub-entry detects a MATCH-ing sub-entry.

19. The method of claim 18, wherein asserting the predetermined binary logic voltage level at the first block output only if the CAM comparison on the first sub-entry detects a MATCH-ing sub-entry includes providing a delay between the first block input and the first block output.

20. The method of claim 19, further comprising asserting the predetermined binary logic voltage level at the second block output only if the CAM comparison on the second sub-entry detects a MATCH-ing sub-entry.

21. The method of claim 20, wherein asserting the predetermined binary logic voltage level at the second block output only if the CAM comparison on the second sub-entry detects a MATCH-ing sub-entry includes providing a delay between the second block input and the second block output.

* * * * *